(12) United States Patent
Hartzell et al.

(10) Patent No.: US 7,657,185 B2
(45) Date of Patent: Feb. 2, 2010

(54) ELECTRONIC INTERFACE FOR LONG REACH OPTICAL TRANSCEIVER

(75) Inventors: Robert Hartzell, Emerald Hills, CA (US); Qingmin Zhang, Fremont, CA (US)

(73) Assignee: Opnext, Inc., Fremont, CA (US)

( * ) Notice: Subject to any disclaimer, the term of this patent is extended or adjusted under 35 U.S.C. 154(b) by 556 days.

(21) Appl. No.: 10/764,605

(22) Filed: Jan. 26, 2004

(65) Prior Publication Data

US 2005/0175350 A1 Aug. 11, 2005

(51) Int. Cl.
*H04B 10/24* (2006.01)
(52) U.S. Cl. ......................................... 398/135; 257/84
(58) Field of Classification Search ......... 398/135–139; 257/82, 84
See application file for complete search history.

(56) References Cited

U.S. PATENT DOCUMENTS

| 4,766,471 | A | | 8/1988 | Ovshinsky et al. | |
|---|---|---|---|---|---|
| 5,005,939 | A | * | 4/1991 | Arvanitakis et al. | 385/53 |
| 5,039,194 | A | * | 8/1991 | Block et al. | 385/88 |
| 5,097,393 | A | | 3/1992 | Nelson et al. | |
| 5,202,943 | A | * | 4/1993 | Carden et al. | 385/92 |
| 5,323,520 | A | | 6/1994 | Peters et al. | |
| 5,479,288 | A | * | 12/1995 | Ishizuka et al. | 398/164 |
| 5,565,675 | A | * | 10/1996 | Phillips | 250/239 |
| 5,696,657 | A | * | 12/1997 | Nourrcier et al. | 361/93.8 |
| 5,742,480 | A | * | 4/1998 | Sawada et al. | 361/749 |
| 5,777,383 | A | * | 7/1998 | Stager et al. | 257/700 |
| 6,150,193 | A | * | 11/2000 | Glenn | 438/113 |
| 6,617,518 | B2 | * | 9/2003 | Ames et al. | 174/254 |
| 7,049,676 | B2 | * | 5/2006 | Tanabe et al. | 257/508 |
| 7,136,594 | B2 | * | 11/2006 | Nakanishi et al. | 398/164 |
| 2002/0140081 | A1 | * | 10/2002 | Chou et al. | 257/700 |
| 2003/0127704 | A1 | * | 7/2003 | Kobayashi et al. | 257/531 |
| 2003/0142929 | A1 | | 7/2003 | Bartur et al. | |
| 2008/0007930 | A1 | * | 1/2008 | Daikuhara et al. | 361/807 |

OTHER PUBLICATIONS

Ramaswami, R. and K.N. Sivarajan. Optical Networks: A Practical Perspective. 2nd ed. San Francisco: Morgan Kaufmann Publishers, 2002.*

* cited by examiner

*Primary Examiner*—Leslie Pascal
(74) *Attorney, Agent, or Firm*—Finnegan, Henderson, Farabow, Garrett & Dunner, LLP

(57) ABSTRACT

A low form-factor transceiver system appropriate for long-reach optical communications is presented. In accordance with the present invention, an electronic interface to a receiver optical sub assembly (ROSA) and a transmitter optical sub assembly (TOSA) is arranged on a multi-layer board to electrically shield the transmitter and receiver portions from a high-voltage power supply, which is utilized to provide bias voltages to optical detectors in the ROSA. In some embodiments of the invention, the high-voltage power supply is arranged on a top layer while the transmitter and receiver are arranged on a bottom layer in a split-ground arrangement. Layers between the top layer and the bottom layer include at least one ground plane and provide vias for electrical connections.

13 Claims, 13 Drawing Sheets

INTERNAL 1

FIG. 8 MID LAYER

ELECTRONIC INTERFACE FOR LONG REACH OPTICAL TRANSCEIVER

BACKGROUND

1. Field of the Invention

The present invention relates to optical communication systems and, particularly to an electronic interface for small form factor high-speed optical transceivers with high sensitivity optical receivers.

2. Discussion of Related Art

There is currently a demand for high-speed, long-distance, cost-effective, and highly integrated optical transceiver systems. Therefore, optical receiver systems that are high performance, low cost, and are of small size are desired. A transceiver typically includes both a transmitter system and a receiver system. A fiber optical transceiver, therefore, can include a receiver optical sub assembly (ROSA), a transmitter optical sub assembly (TOSA), and an electronic interface connecting the ROSA and TOSA.

For short reach and medium distance transmission, the ROSA may include a PIN photo detector based receiver for detecting light from an optical fiber. For long reach transceivers (e.g., for transmission over tens of kilometers), however, high sensitivity receivers are required to compensate for the optical signal loss due to long optical fibers. In long distance systems, then, an avalanche photodiode (APD) can be utilized instead of a PIN photodiode because of its higher sensitivity and lower noise characteristics.

The TOSA can include a laser diode and optics for coupling optical signals generated by the laser diode into a fiber. The electronic interface to the TOSA and ROSA, then, includes drivers for the TOSA, receivers for the ROSA, and power supplies to power the laser diodes and the receiver chips of the ROSA and TOSA. In conventional systems, the electronic circuitry of the power supplies, the transmission circuitry, and the receiver circuitry are well separated in order to minimize the amount of noise generated on the received signals and on the transmitted signals due to the electronics. However, such an arrangement can require a great deal of space for the transceiver system.

Therefore, there is a need for optical transceiver systems, and in particular for long reach optical transceiver systems that have a small form factor and that are arranged to minimize interference and noise on the received signals.

SUMMARY

In accordance with embodiments of the present invention, a transceiver system is presented that has a small form factor. A transceiver system according to the present invention includes a receiver optical sub assembly, a transmitter optical sub assembly, and an electronic interface coupled to the receiver optical sub assembly and the transmitter optical sub assembly, wherein the electronic interface utilizes a split ground arrangement in a multi-layer circuit board assembly. The result of the split ground, multi-layer circuit board arrangement is that a high-voltage bias supply required for high-speed transceiver functions can be shielded from the transceiver. Further, in some embodiments, internal conducting layers can operate as shields to further assist in shielding the receiver functions from the high-voltage signal generation.

These and other embodiments are further discussed below with reference to the following figures.

In the figures, elements having the same designation have the same or similar function.

DETAILED DESCRIPTION

Figure 1:
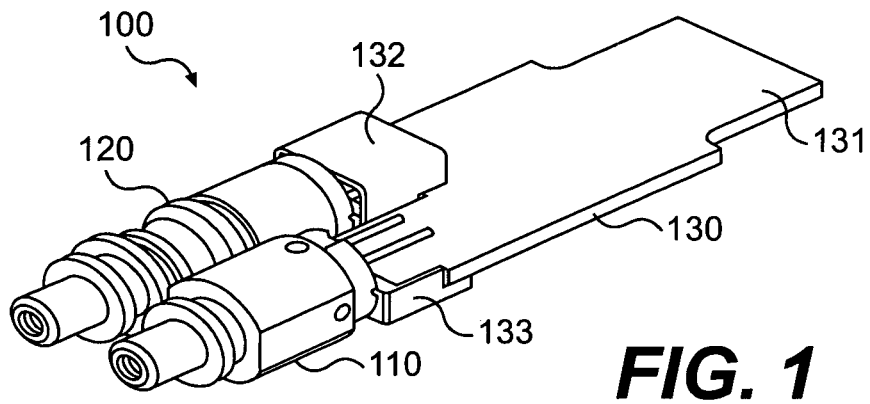
FIG. 1 shows a transceiver according to certain embodiments of the present invention.

FIG. 1 illustrates a transceiver 100 according to some embodiments of the present invention. In some embodiments, transceiver 100 is housed in a metallic case (not shown). Transceiver 100 includes a receiver optical sub assembly (ROSA) 110, a transceiver optical sub assembly (TOSA) 120, and a multi-layer board 130. ROSA 110 includes optics for receiving optical signals from an optical fiber and focusing the optical signals onto a detector. The detector of ROSA 110 converts the optical signals into electrical signals that are coupled to the electronic interface formed on multi-layer board 130. Typically, electrical connections between ROSA 110 and the electronic interface circuit formed on multi-level board 130 include conductors for carrying a high-voltage bias voltage, a power supply voltage, a differential current signal, and a ground. The electrical signals and their characteristics depend on the particular optical detector and supporting circuitry housed in ROSA 110. For example, if ROSA 110 includes an avalanche photodiode and supporting transimpedance amplifier for utilization in a long-reach optical system, then the bias voltage may be about 70 V while the power supply voltage is about 3.3 V. The differential voltage (i.e., the voltage across the conductors carrying the differential current signal) can be as high as 400 mV, depending on the intensity of the optical radiation incident on the active area of the photodetector.

TOSA 120 converts electrical signals into optical signals for transmission on an optical fiber. As such, TOSA 120 typically includes a laser diode and optics for coupling the light generated by the laser diode into an optical fiber and a photo diode to monitor the average optical power. Electrical signals into TOSA 120, then, can include power and ground for the laser diode as well as electrical signals to be transmitted optically over an optical fiber.

An electronic interface circuit according to the present invention can be built on multi-level board 130. Multi-level board 130, then, includes electrical connections to ROSA 110 and to TOSA 120. Additionally, multi-level board 130 includes an electrical connection 131 for making electrical connections external to transceiver 100. Electrical connection 131 can be any electrical connector, for example a PCB edge finger connector. Further, transceiver 100 may include covers 132 and 133 for protecting and shielding the electrical connections between ROSA 110 and the electronic interface on multi-layer board 130 and TOSA 120 and the electronic interface on multi-level board 130. An embodiment of ROSA 110 that can be utilized in transceiver system 100 is disclosed in U.S. application Ser. No. 10/764,979, which is filed concurrently with the present disclosure, and is herein incorporated by reference in its entirety.

Figure 2:
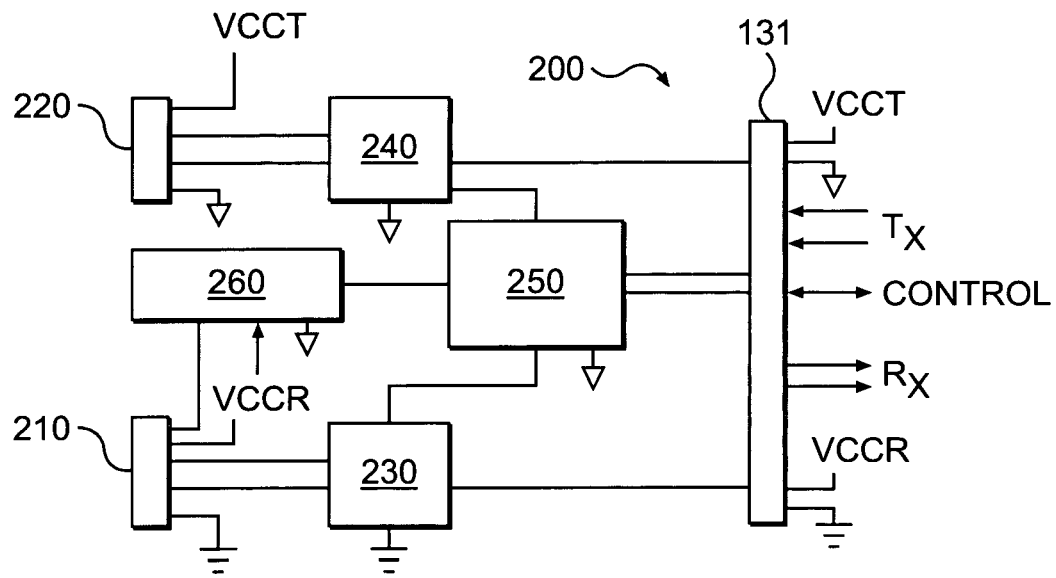
FIG. 2 shows a block diagram of an electronic interface according to some embodiments of the present invention.

FIG. 2 shows a simplified block diagram of an example of electronic interface 200 that can be formed on multi-layer board 130. Electronic interface 200 includes electrical connection 131 where signals can be coupled to the remainder of electronic interface 200. Electronic interface 200 includes a transmitter portion 240 coupled to board traces 220. Transmitter portion 240 receives signals from connector 131 and provides signals to TOSA 120 through board traces 220. Transmitter portion 240, for example, can include a laser driver to control a laser diode in TOSA 120. Receiver portion 230 receives signals from board traces 210, which is coupled to ROSA 110, and provides signals to connector 131 in response to the received signals from connector 210. The signals from ROSA 110 are derived from an optical detector which, in some embodiments, can be an avalanche photodiode.

The photodetector of ROSA 110, in some embodiments, can require application of a large bias voltage. An avalanche photodiode, for example, can require a bias voltage of about 70V or more. Therefore, electronic interface 200 includes a high-voltage power supply 260 that generates the bias voltage for the photodetector of ROSA 110. In some embodiments, high-voltage power supply 260 can be a DC-DC switching voltage supply. In high-voltage power supply 260, a low-voltage input signal (e.g., a 3.3V power supply input) can be converted to a high voltage output signal (e.g., about 70V) in the switching power supply of high-voltage power supply 260.

In some embodiments of electronic interface 200, a microcontroller system 250 can monitor and control operation of electronic interface 200. Microcontroller system 250 can monitor transmitter 240, receiver 260, and high-voltage power supply 260 and provide status signals to connector 131. Further, microcontroller system 250 may receive signals through connector 131 that relate to control of transmitter 240, receiver 230, and high-voltage power supply 260.

High-voltage power supply 260, however, can provide a large source of interference to signals in both transmitter portion 240 and receiver portion 230. Therefore, in a transceiver system according to some embodiments of the present invention, transmitter portion 240 and receiver portion 230 are shielded from high-voltage power supply 260.

Figure 3:
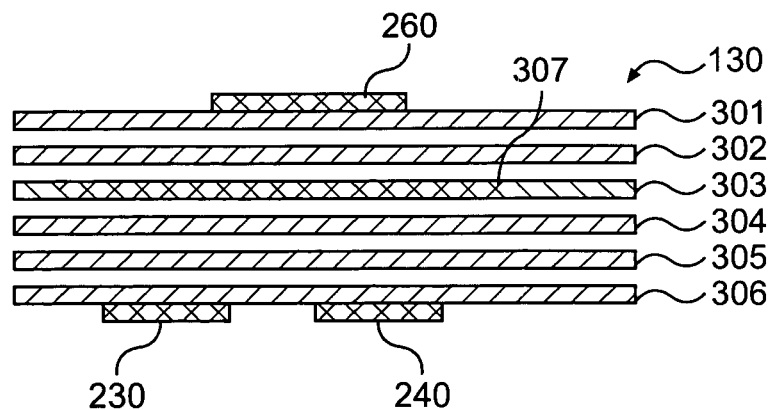
FIG. 3 illustrates a multi-layer board according to some embodiments of the present invention.
Figure 4A:
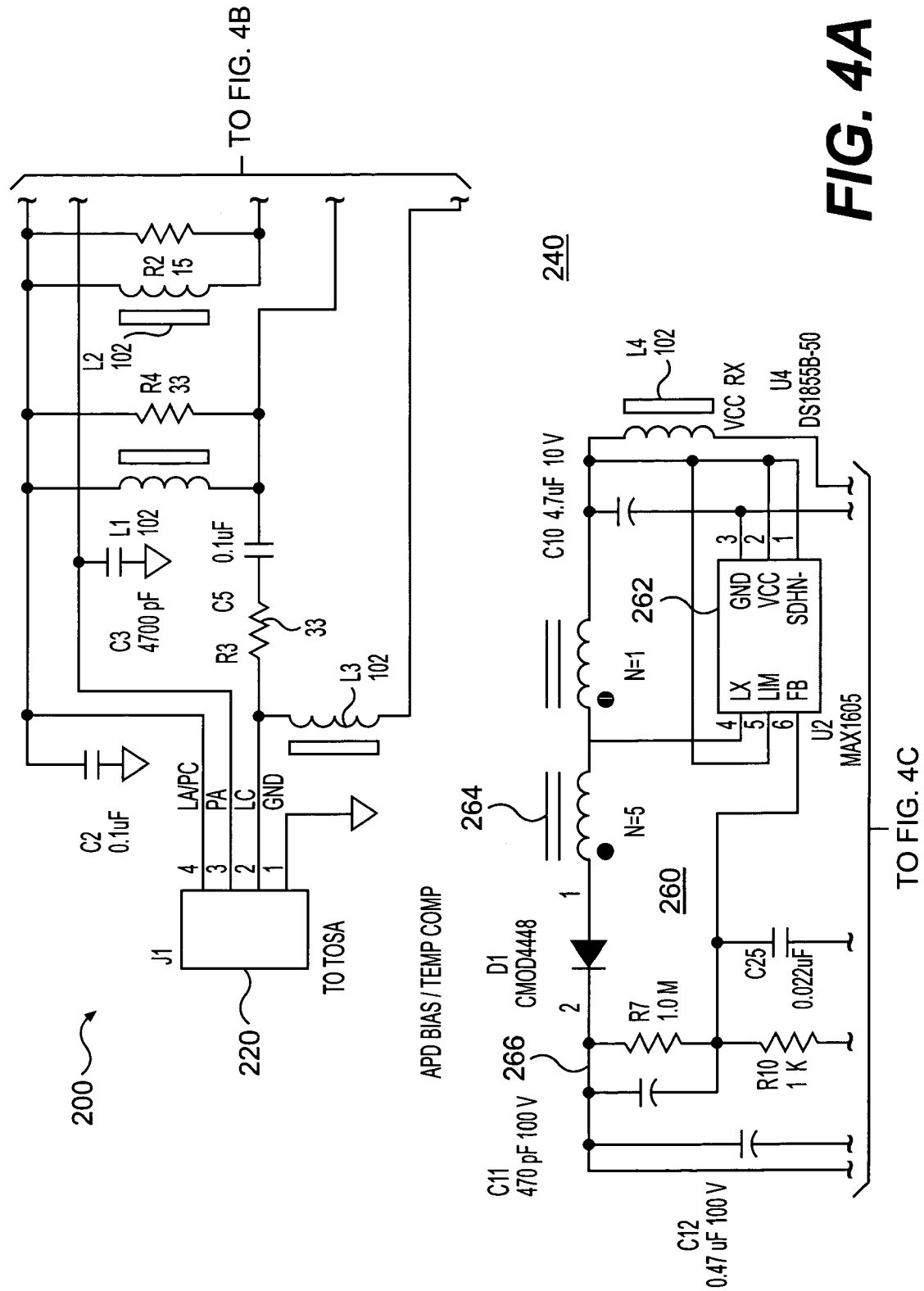
FIGS. 4A-4D show a circuit diagram of an embodiment of electronic interface according to some embodiments of the present invention.
Figure 4B:
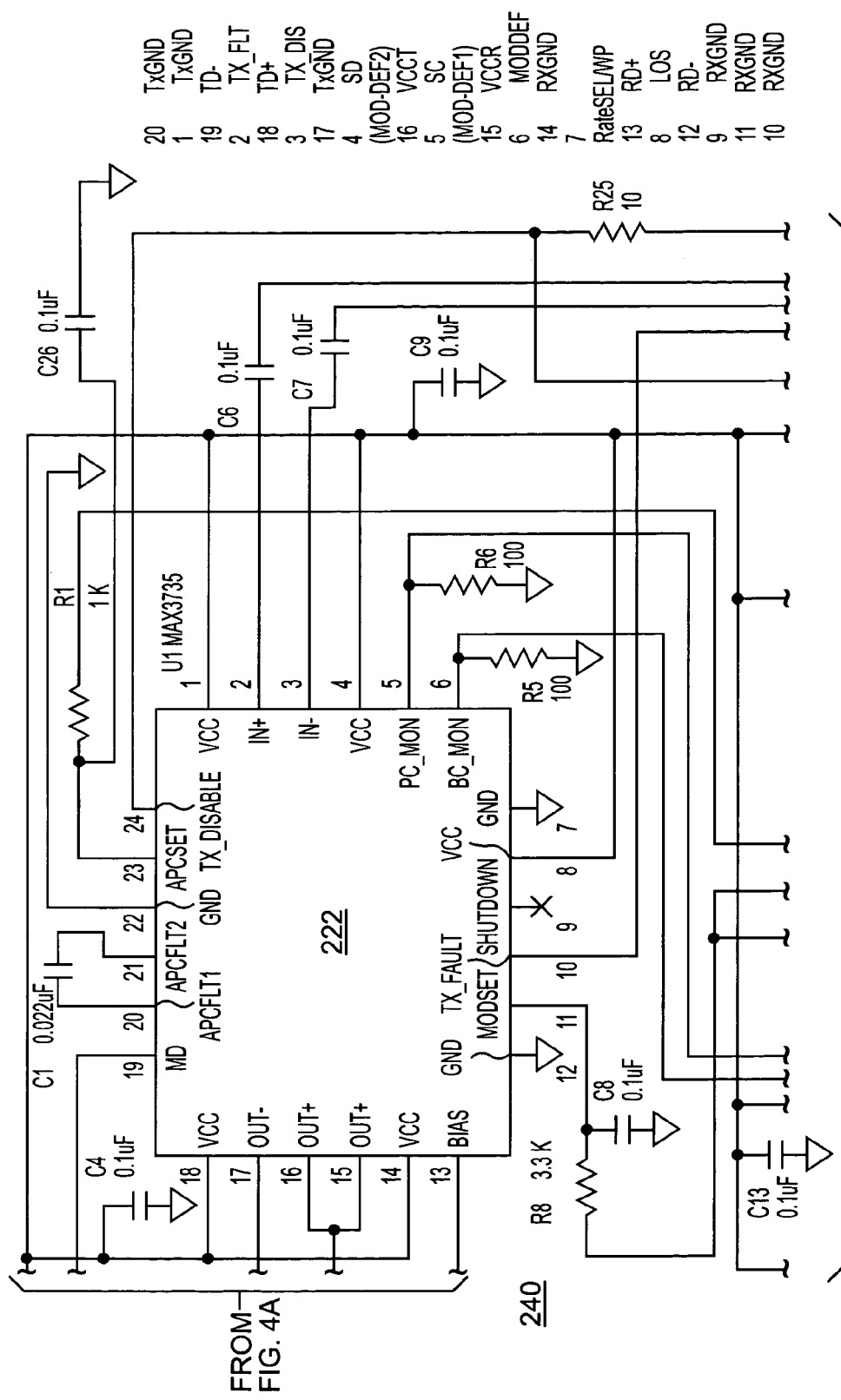
Figure 4C:
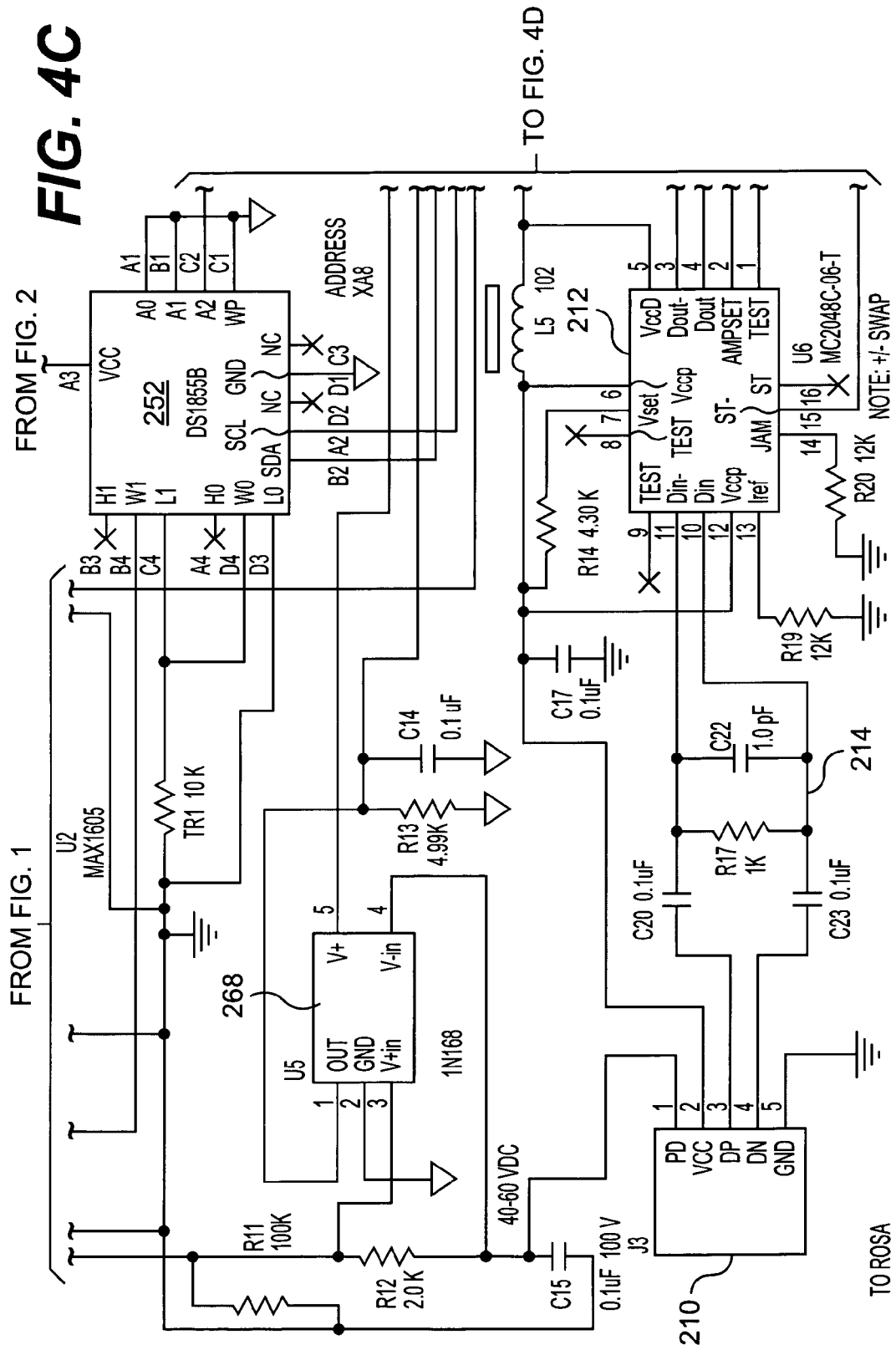
Figure 4D:
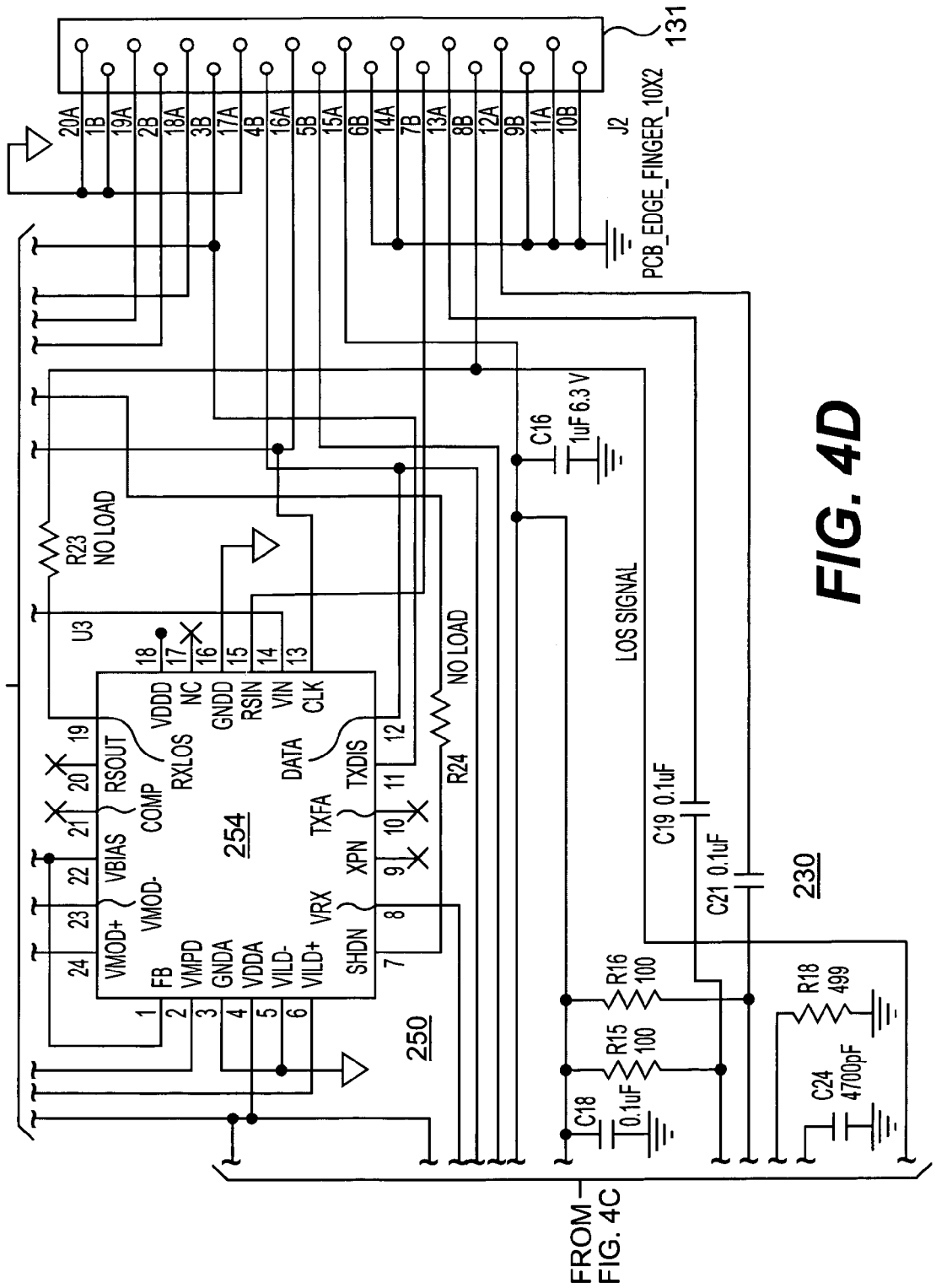

FIG. 3 shows an embodiment of multi-level board 130 that illustrates the configuration of electronic interface 200. In the embodiment of multi-level board 130 shown in FIG. 3, six layers of board are formed and coupled together. High-voltage power supply 260 is formed on layer 301, the top layer, of multi-level board 130. Transmitter 230 and receiver 240 are formed on layer 306, the bottom layer, which is on the opposite side of multi-level board 130. Additionally, as shown in FIG. 2, the ground of receiver 230 and on connector 210 is split from the ground of transmitter 240 in order to help shield receiver 230 from the remainder of electronic interface 200. The grounds of high-voltage power supply 260 and microcomputer system 250 can be the same as the ground of transmitter 240. Although a six-layer stacking embodiment is illustrated in this disclosure, other layer arrangements can be utilized. In accordance with some embodiments of the present invention, a transceiver system includes an electronic interface arranged on a multi-level board where high-voltage power supply 260 is electrically shielded from transmitter 240 and receiver 230.

Therefore, in the embodiment illustrated in FIG. 3, layer 301 will include metallic traces for the circuitry of high-voltage power supply 260. Layer 301 may also include metallic traces for portions of connector 131 and connectors 220 and 210. Layer 302 includes metallic vias to provide electrical connection from underlying boards to portions of connector 131 and connectors 220 and 210 (not shown). Layer 303 includes vias for electrical connections between boards and a copper shielding plane 307, which may occupy some or all of layer 303. Layer 304 includes metallic traces to provide interconnects between circuit elements. Electrical connections can be made through vias in other board layers. Layer 305 provides electrical vias between layer 304 and layer 306. Layer 306 provides metallic traces for the circuitry of, for example, receiver 230 and transmitter 240.

Board layers 301, 302, 303, 304, 305, and 306 are positioned in contact with one another and connections between boards can be made in well-know ways, for example by pressure, adhesives, and heating the assembly, to form multi-level board 130. The components of electrical interface 260 can then be positioned on layers 301 and 306 and electrically coupled to multi-level board 130.

In some embodiments of multi-level board 130 according to the present invention, copper shielding plane 307 is a ground plane that may be floating with respect to the split-ground of electrical interface 200. Copper shielding plane 307 is positioned between high-voltage power supply 260 and the circuitry of transmitter 230 and 240 in order to provide electrical shielding. Electromagnetic signals emanating from high-voltage power supply 260, then, are blocked by shielding ground plane 307 before interfering with the signals of receiver 230 and transmitter 240. Each ground, the split grounds of electronic interface 200 and copper shielding plane 307, are coupled to ground external to multi-layer board 130.

As such, high-voltage power supply 260 and high-speed receiver 230 and transmitter 240 are assembled on multi-layer board 130 and the internal construction of multi-layer board 130 provides shielding to shield high-voltage power supply 260 from high-speed receiver 230 and transmitter 240. Multi-layer board 130 also utilizes "blind vias" for interconnects between layers.

FIG. 4 shows an embodiment of electrical interface 200 that can be implemented on multi-level board 130. Electrical interface 200 includes a receiver portion 230 and a transmitter portion 240. Receiver portion 230 includes connector 210 and amplifier 212. In some embodiments, amplifier 212 can be a MC2048C-06-T amplifier available from Mindsped, Inc. In some embodiments, board trace 210 can provide connections for a bias voltage, power, ground, and a differential signal output. In some embodiments, the bias voltage can be large, e.g. about 70 V. Power can be supplied through connector 131 and can be, for example, about 3.3 V. The differential signal can be filtered in an integrating filter 214 before being input to amplifier 212. The output signals from amplifier 212 can be coupled to connector 131.

Transmitter portion 240 includes board traces 220 and laser driver 222. Laser driver 222 can be, for example, a MAX3735 driver available from Maxim, Inc. Board traces 220 are capable of providing signal, power, and ground to TOSA 120.

Electronic interface 200, in some embodiments, can be controlled by a microcontroller system 250. Microcontroller system 250 can include a microcontroller 254 that can be coupled to a memory 252 where data and program instructions can be stored. Microcontroller 254, for example, can be an MC3000 microcontroller available from Micrel, Inc. Memory 252 can, for example, be a DS18455B-50 memory chip available from Maxim, Inc. Microcontroller system 250 can receive signals from amplifier 212 of receiver portion 230 and from laser driver 222 of transmitter portion 240 in order to control and monitor aspects of electronic interface 200. Microcontroller system 250 can also be coupled with connector 131 so that data can be communicated out of electronic interface 200.

High DC voltage can be generated in switching power supply 260. Switching power supply 260 includes switch 262, transformer 264, and rectifier circuit 266. Switching circuit 262 may, for example, be a MAX1605 switching circuit available from Maxim, Inc. Switching circuit 262 provides a low voltage, for example 3.3V, signal to transformer 264. The low voltage signal can be a square wave signal or sine signal with frequency of about 240 kHz. Transformer 264 steps up the voltage to the desired high-voltage level, for example about 70V. Rectifier circuit 266, then, rectifies the signal from transformer 264 and provides a DC voltage for use, for example, in ROSA 110 as a bias voltage. Some embodiments of electronic interface 200 may include further filtering and other signal shaping circuits. The voltage from rectifier 266, for example, may be utilized in sampler 268 to provide a monitor signal to microprocessor 250. Sampler 268, for example, can be a 1N168 chip, which can be obtained from BurrBrown, Inc.

Switching power supply 260, in addition to providing higher DC voltages for aspects of transceiver 100, also is a large source of noise and interference for signals received at board traces 210 and, to a lesser extent, provide noise for transmission of signals through board traces 220. Therefore, receiver portion 230 needs to be shielded from switching power supply 260. In conventional systems, high-voltage power supply 260 can simply be separated by a large enough distance from the remainder of electronic interface 200 that the interference is minimized. This solution, however, provides for a very large form factor for transceiver system 100. Instead, in accordance with the present invention, a split ground plane in multi-layer board 130 can be utilized to shield receiver 230 and transmitter 240 from high-voltage power supply 260.

As is shown in FIG. 4, the ground signals utilized in transmitter portion 240 and in high-voltage power supply 260 are split from the ground utilized in receiver portion 230. As shown in FIG. 4, the two grounds are indicated by the separate ground symbols (∇ and ⏚). Further, to provide further shielding, receiver portion 230 and transmitter portion 240 is primarily formed on the bottom layer of multi-layer board 130 while switching power supply 260 are primarily formed on the top layer of multi-layer board 130.

Figure 5A:
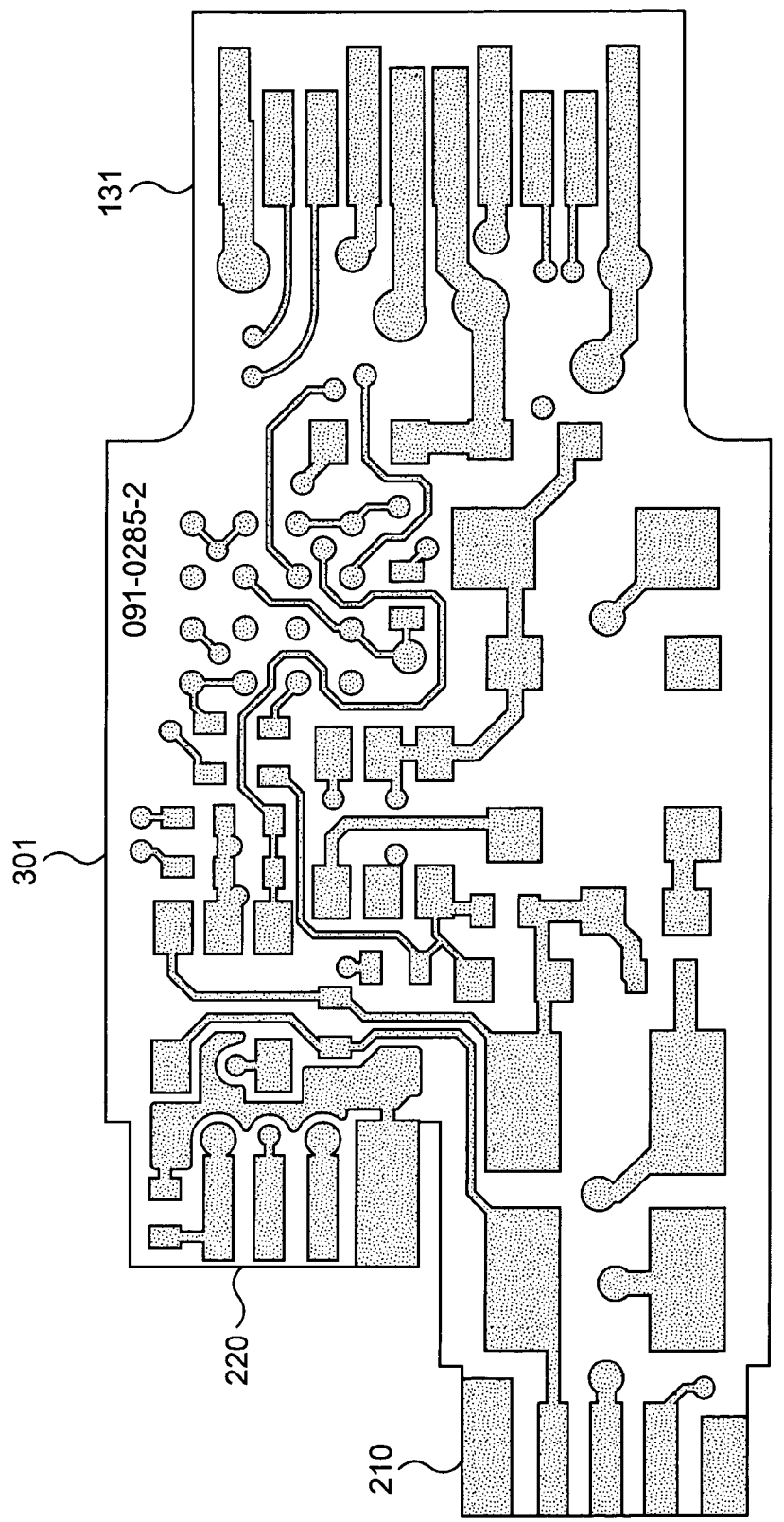
FIGS. 5A and 5B show a first layer of a multi-layer circuit board according to the present invention.

FIG. 5A illustrates the metal traces for layer 301 (FIG. 3) of multi-layered board 130 where electronic interface 200 as illustrated in FIG. 4 is implemented. Further, the metal traces of board traces 131, 220 and 210 are shown. Additionally, interconnections and vias are shown.

Figure 5B:
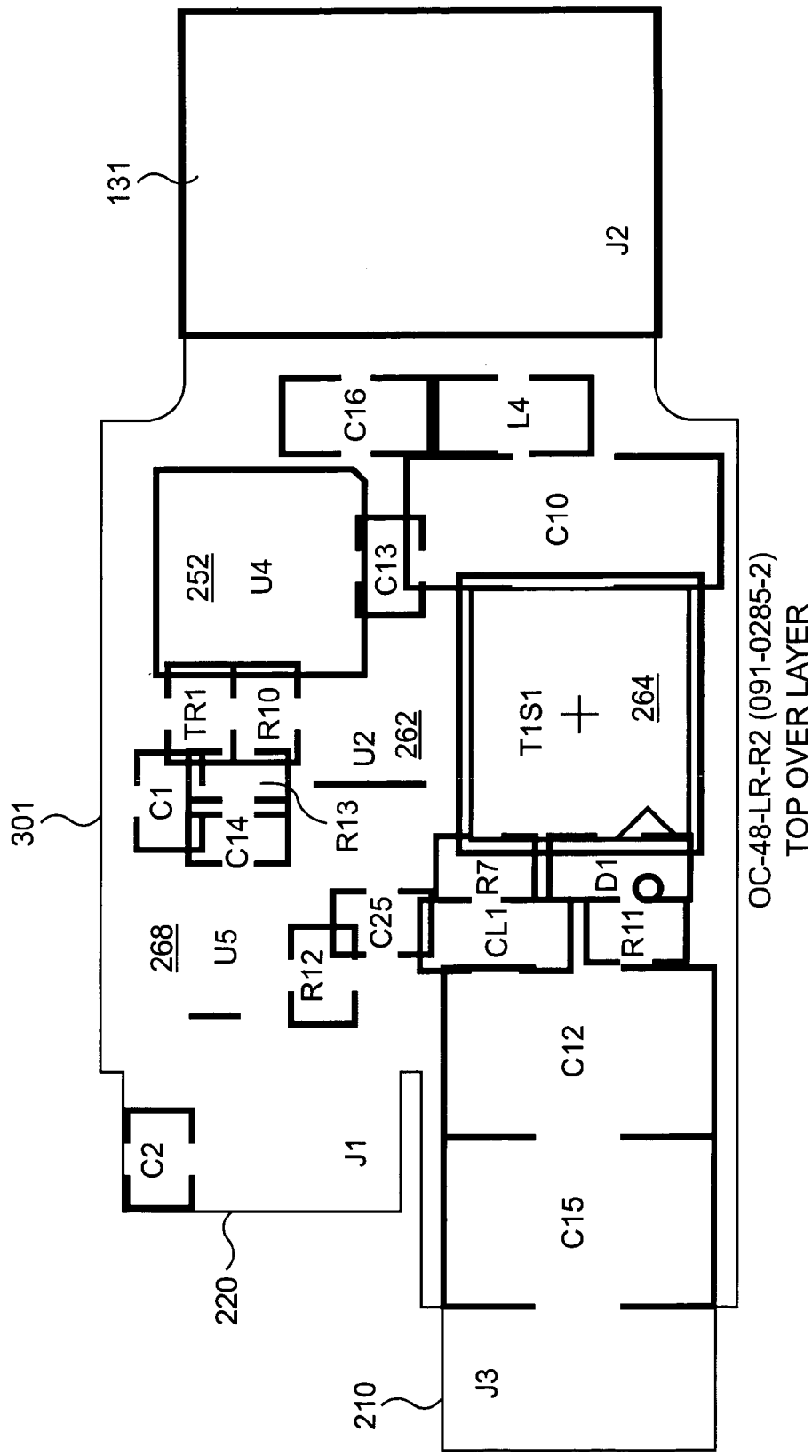

FIG. 5B illustrates the component lay-out on layer 301 according to some embodiments of the present invention. As is shown, transformer 264 is prominently placed on board 301. Additionally, switching circuit 262 is placed proximate to transformer 264. Rectifier 266, which in the embodiment of electronic interface 200 shown in FIG. 4 includes diode D1 and capacitor C12, is proximately arranged about transformer 264. Additionally, sampling circuit 268 is positioned on layer 301. Because the signals for microcontroller 250 are of slower speed and are relatively unaffected by interference from high-voltage power supply 260, part of microcontroller 250 can also be positioned on layer 301. In the embodiment shown in FIG. 5B, therefore, memory 252 is positioned on layer 301.

Figure 6:
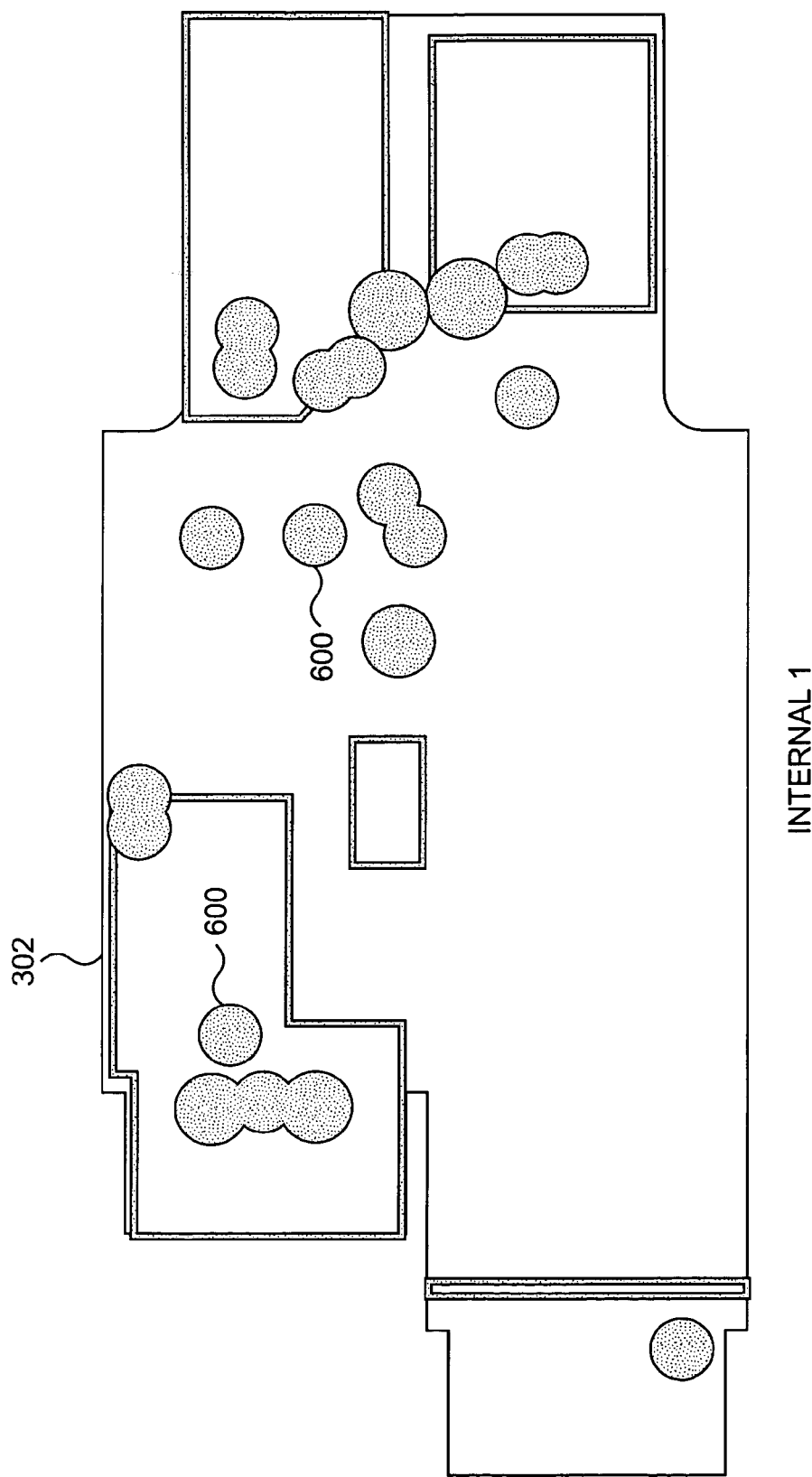
FIG. 6 shows a second layer of a multi-layer circuit board according to some embodiments of the present invention.

FIG. 6 illustrates the arrangement of vias 600 on layer 302 of multi-layer board 130. Vias 600 provide interboard interconnects in order to affect the electronic circuitry of electronic interface 200. Vias 600 are "blind vias" in that, when multi-layer board 130 is assembled, electrical connections are made when the board is aligned, without specific alignment of the vias themselves.

Figure 7:
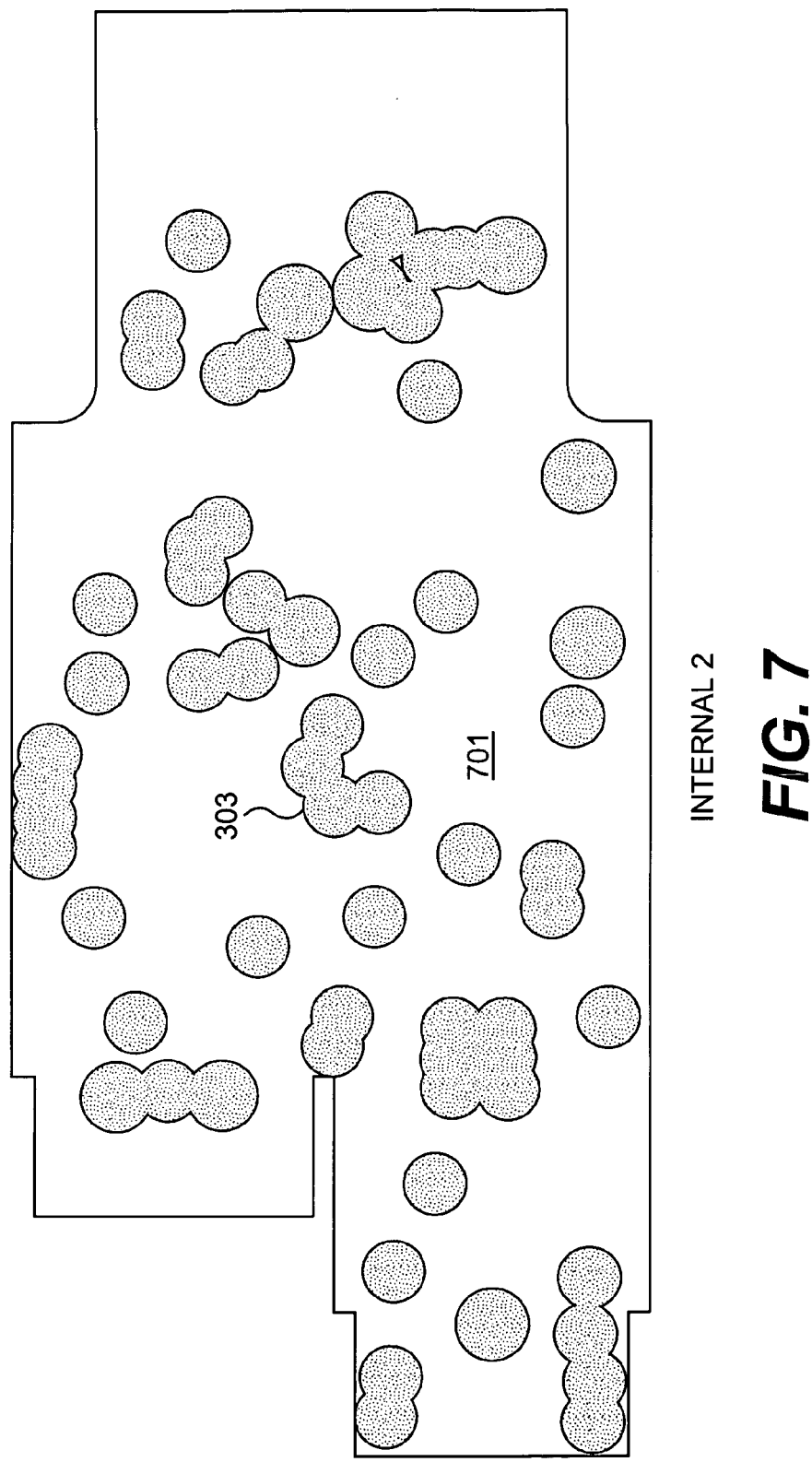
FIG. 7 shows a third layer of a multi-layer circuit board according to some embodiments of the present invention.

FIG. 7 illustrates the arrangement of vias 700 on layer 303. Additionally, layer 303 can provide a copper plane 701 to provide electrical shielding under high-voltage power supply 260.

Figure 8:
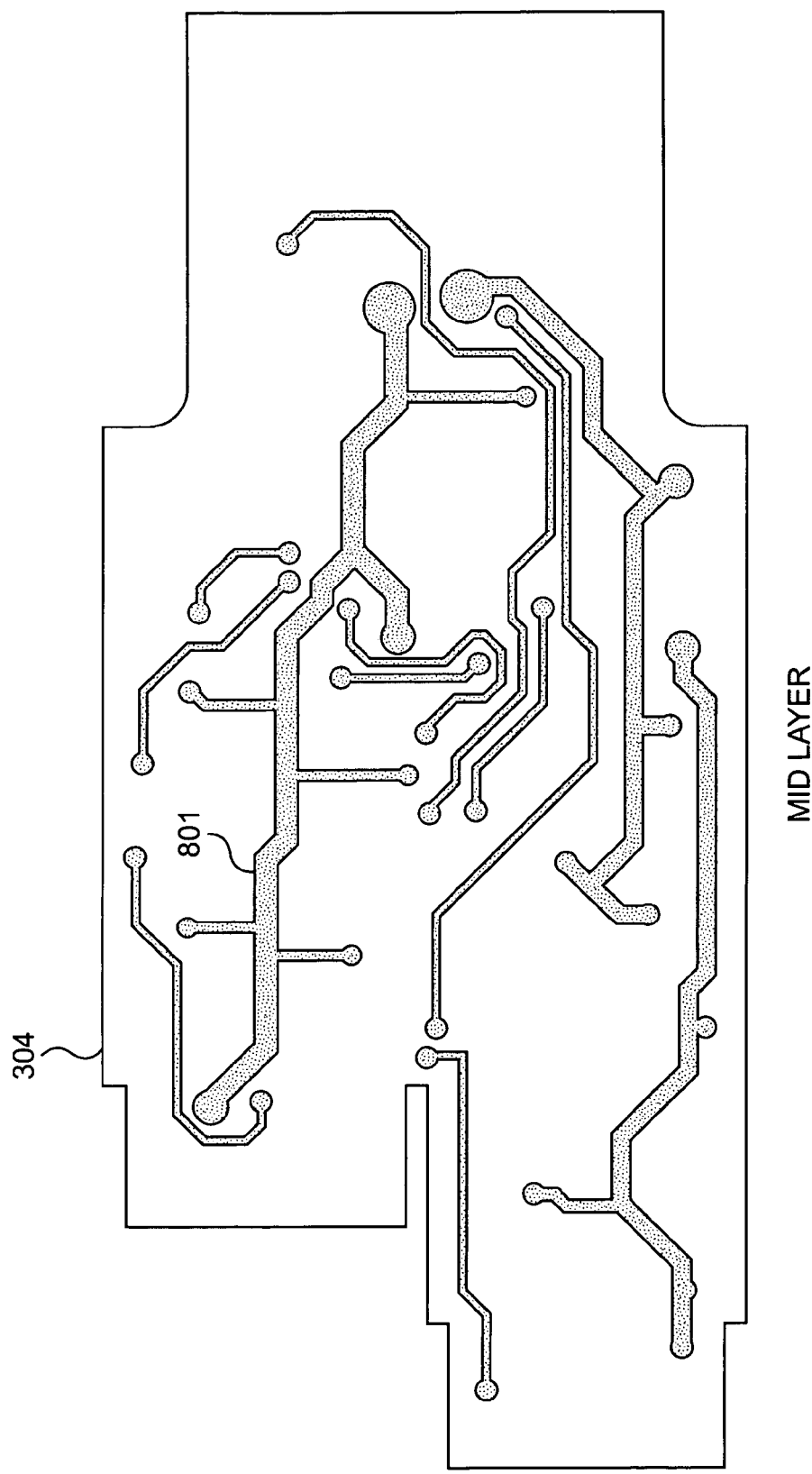
FIG. 8 shows a fourth layer of a multi-layer circuit board according to some embodiments of the present invention.

FIG. 8 illustrates electrical interconnects 801 on layer 304. Interconnects 801 can provide electrical connections between vias on layer 303 and layer 305.

Figure 9:
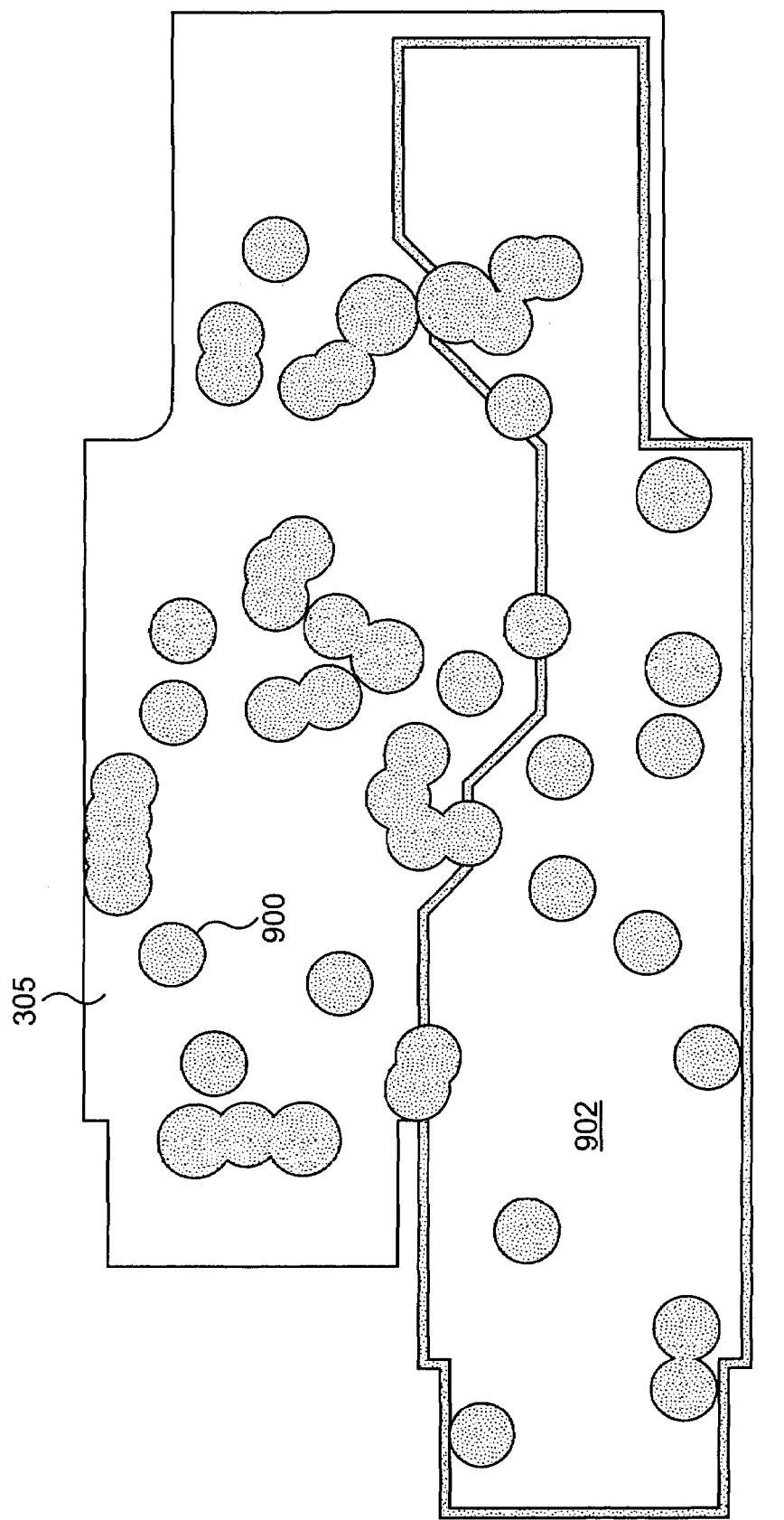
FIG. 9 shows a fifth layer of a multi-layer circuit board according to some embodiments of the present invention.

FIG. 9 illustrates vias 900 on layer 305. Further, layer 305 can also include further copper plane shielding 902 for further shielding of receiver 230 and transmitter 240.

Figure 10:
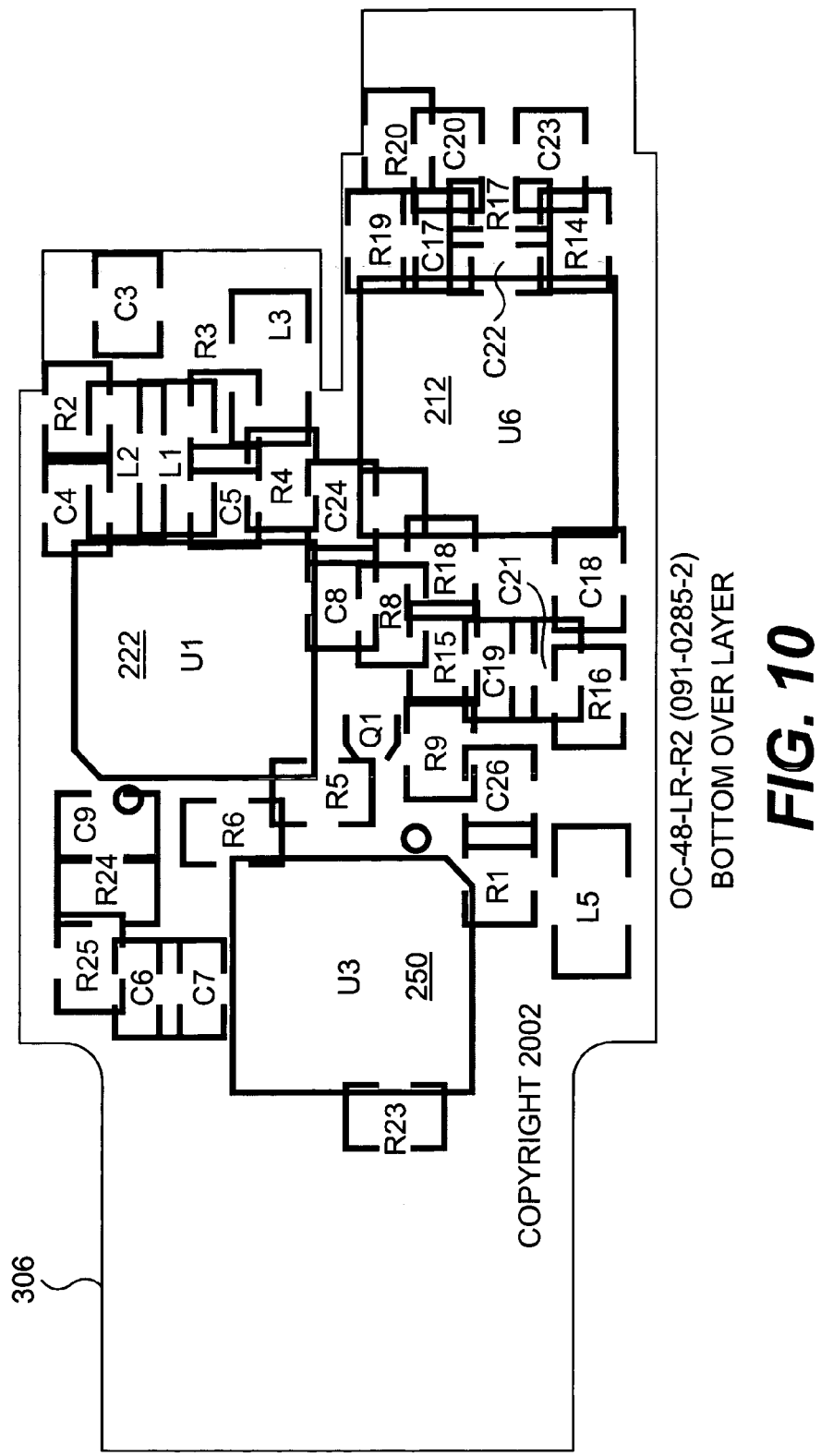
FIG. 10 shows a bottom layer of a multi-layer circuit board according to some embodiments of the present invention.

FIG. 10 illustrates the arrangement of components on layer 306. As is shown, laser driver 222 of transmitter 240 and amplifier 212 of receiver 230 are arranged on layer 306. Additionally, microcontroller 250 is also mounted on layer 306. Electrical connections between microcontroller 250 and memory 252, which is mounted on layer 301, are made through multi-layer board 130.

Figure 11:
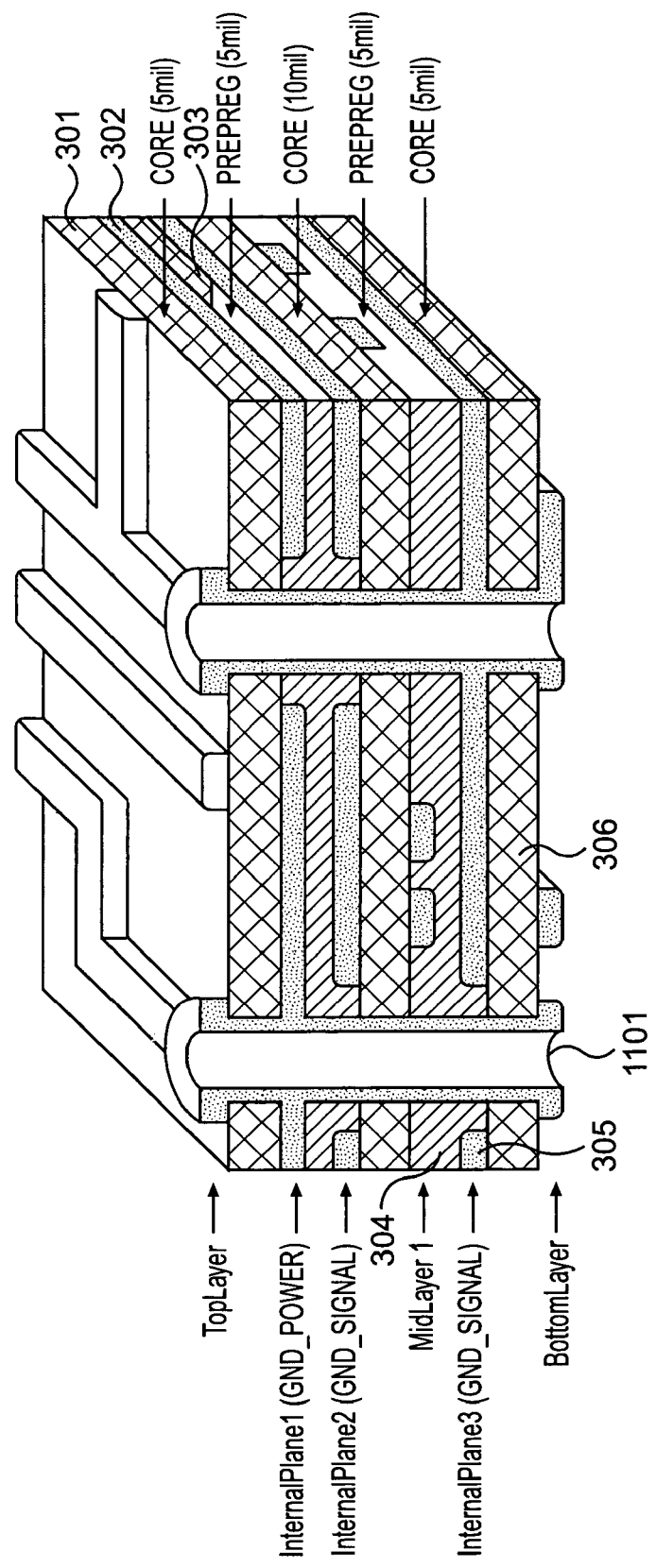
FIG. 11 shows a cross section of an embodiment of multi-layer circuit board according to some embodiments of the present invention.

FIG. 11 illustrates a cross section of multi-layer board 130. Layers 301, 302, 303, 304, 305, and 306 are stacked and interconnects are made through vias 1101 in and metallic traces in multi-layer board 130.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A transceiver system, comprising:
   a transmitter portion arranged on a contiguous bottom layer of a multi-layer printed circuit board, the transmitter portion capable of providing signals to a transmitter optical subassembly configured to transmit optical signals from the transceiver system;
   a receiver portion arranged on the contiguous bottom layer of the multi-layer printed circuit board, the receiver portion capable of receiving signals from a receiver optical subassembly configured to receive optical signals into the transceiver system;
   a high-voltage power supply arranged on a top layer of the multi-layer printed circuit board, the high-voltage power supply providing a bias voltage for the receiver optical subassembly; and
   a metallic ground plane arranged on a first intermediate layer of the multi-layer printed circuit board between the top layer and the contiguous bottom layer, the metallic ground plane providing electrical shielding between the high-voltage power supply and the transmitter portion and the receiver portion.

2. The system according to claim 1, wherein the transmitter portion and the receiver portion are arranged in a split-ground arrangement.

3. The system according to claim 1, wherein a second intermediate layer of the multi-layer printed circuit board having vias is arranged between the first intermediate layer and the top layer.

4. The system according to claim 3, wherein a third intermediate layer of the multi-layer printed circuit board having vias is arranged between the first intermediate layer and the contiguous bottom layer.

5. The system according to claim 4, wherein an interconnect layer is arranged between the first intermediate layer and the third intermediate layer.

6. The system according to claim 1, further including a microcontroller system arranged on the top layer and the contiguous bottom layer.

7. A transceiver system, comprising:
means for receiving signals from a receiver optical subassembly configured to receive optical signals into the transceiver system, the means for receiving being arranged on a contiguous bottom layer of a multi-layer printed circuit board;
means for transmitting signals through a transmitter optical subassembly configured to transmit optical signals from the transceiver system, the means for transmitting being arranged on the contiguous bottom layer of the multi-layer printed circuit board;
means for generating a high-voltage bias for the receiver optical subassembly, the means for generating being arranged on a top layer of the multi-layer printed circuit board;
means for electrically shielding the means for generating the high-voltage bias from the means for receiving and the means for transmitting, the means for electrically shielding being arranged on a first intermediate layer of the multi-layer printed circuit board between the top layer and the contiguous bottom layer.

8. A method of shielding a high voltage power supply providing a bias voltage for an optical assembly, comprising:
arranging the high voltage power supply on a top layer of a multi-stack printed circuit board;
arranging a receiver and a transmitter on a contiguous bottom layer of the multi-stack printed circuit board, the receiver being capable of receiving signals from a receiver optical subassembly, the transmitter being capable of transmitting signals to a transmitter optical subassembly; and
arranging a shielding plane on a first intermediate layer of the multi-stack printed circuit board;
wherein the receiver optical subassembly and the transmitter optical subassembly are configured to respectively receive and transmit optical signals into and from a transceiver system that includes the receiver and the transmitter.

9. The method of claim 8, further including providing a split ground between the high-voltage power supply and the other circuitry.

10. The method of claim 8, further including arranging a second intermediate layer of the multi-stack printed circuit board between the top layer and the contiguous bottom layer, the second intermediate layer including vias to provide electrical contact with traces on the top layer.

11. The method of claim 10, further including arranging a third intermediate layer of the multi-stack printed circuit board between the first intermediate layer and the second intermediate layer, the third intermediate layer providing traces.

12. The method of claim 11, further including arranging a fourth intermediate layer of the multi-stack printed circuit board between the first intermediate layer and the contiguous bottom layer, the fourth intermediate layer including vias.

13. A transceiver, comprising:
means for providing a bias voltage formed on a top layer of a multi-layer printed circuit board;
means for receiving a signal from an optical subassembly configured to receive optical signals into the transceiver formed on a contiguous bottom layer of the multi-layer printed circuit board;
means for transmitting a signal through an optical subassembly configured to transmit optical signals from the transceiver formed on the contiguous bottom layer of the multi-layer printed circuit board; and
means for shielding the means for providing a bias voltage from the means for receiving a signal and the means for transmitting a signal, the means for shielding formed on an intermediate layer of the multi-layer printed circuit board between the top and contiguous bottom layers.

* * * * *

UNITED STATES PATENT AND TRADEMARK OFFICE
CERTIFICATE OF CORRECTION

| | | |
|---|---|---|
| PATENT NO. | : 7,657,185 B2 | Page 1 of 1 |
| APPLICATION NO. | : 10/764605 | |
| DATED | : February 2, 2010 | |
| INVENTOR(S) | : Hartzell et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1224 days.

Signed and Sealed this

Thirtieth Day of November, 2010

David J. Kappos
*Director of the United States Patent and Trademark Office*